(12) United States Patent
Martin et al.

(10) Patent No.: US 7,042,725 B2
(45) Date of Patent: May 9, 2006

(54) POWER SWITCHING MODULE AND INVERTER EQUIPPED THEREWITH

(75) Inventors: Nathalie Martin, Tarbes (FR); Benoit Boursat, Bizanos (FR); Emmanuel Dutarde, Mirepeix (FR); Jose Saiz, Aureilhen (FR); Jacques Cettour-Rose, Ordizan (FR); Pierre Solomalala, Aureilhan (FR)

(73) Assignee: Alstom, Levallois-Perret Cedex (FR)

( * ) Notice: Subject to any disclaimer, the term of this patent is extended or adjusted under 35 U.S.C. 154(b) by 56 days.

(21) Appl. No.: 10/821,031

(22) Filed: Apr. 8, 2004

(65) Prior Publication Data

US 2004/0207968 A1 Oct. 21, 2004

(30) Foreign Application Priority Data

Apr. 9, 2003 (FR) .................................. 03 04407

(51) Int. Cl.
*H05K 7/20* (2006.01)
(52) U.S. Cl. ................... 361/699; 165/80.4; 363/141; 257/714; 257/177
(58) Field of Classification Search ................ 361/699; 318/722; 257/714, 177; 165/80.4; 174/15.1, 174/252; 363/141

See application file for complete search history.

(56) References Cited

U.S. PATENT DOCUMENTS

| | | | | |
|---|---|---|---|---|
| 3,921,201 A | * | 11/1975 | Eisele et al. | 257/714 |
| 4,884,168 A | * | 11/1989 | August et al. | 361/702 |
| 5,003,376 A | * | 3/1991 | Iversen | 257/714 |
| 5,504,378 A | * | 4/1996 | Lindberg et al. | 307/10.1 |
| 5,606,201 A | * | 2/1997 | Lutz | 257/714 |
| 6,084,771 A | * | 7/2000 | Ranchy et al. | 361/699 |
| 6,442,023 B1 | * | 8/2002 | Cettour-Rose et al. | 361/690 |
| 6,865,080 B1 | * | 3/2005 | Radosevich et al. | 361/699 |

FOREIGN PATENT DOCUMENTS

| | | |
|---|---|---|
| EP | 0 901 166 | 3/1999 |
| FR | 2765067 | 12/1998 |
| FR | 2775416 | 8/1999 |
| GB | 1416561 | 12/1975 |

OTHER PUBLICATIONS

Rapport De Recherche Preliminaire—FR 03 04407—2 Pgs.

* cited by examiner

*Primary Examiner*—Anatoly Vortman
*Assistant Examiner*—Zachary M. Pape
(74) *Attorney, Agent, or Firm*—Arthur E. Fournier, Jr.

(57) ABSTRACT

A power switching module is provided having at least one power switch placed above at least one other power switch, each power switch in turn including an upper wall and a lower wall, each of which is cooled through thermal conduction by a cooling medium that circulates in channels and voids that are provided along the walls for this purpose.

20 Claims, 4 Drawing Sheets

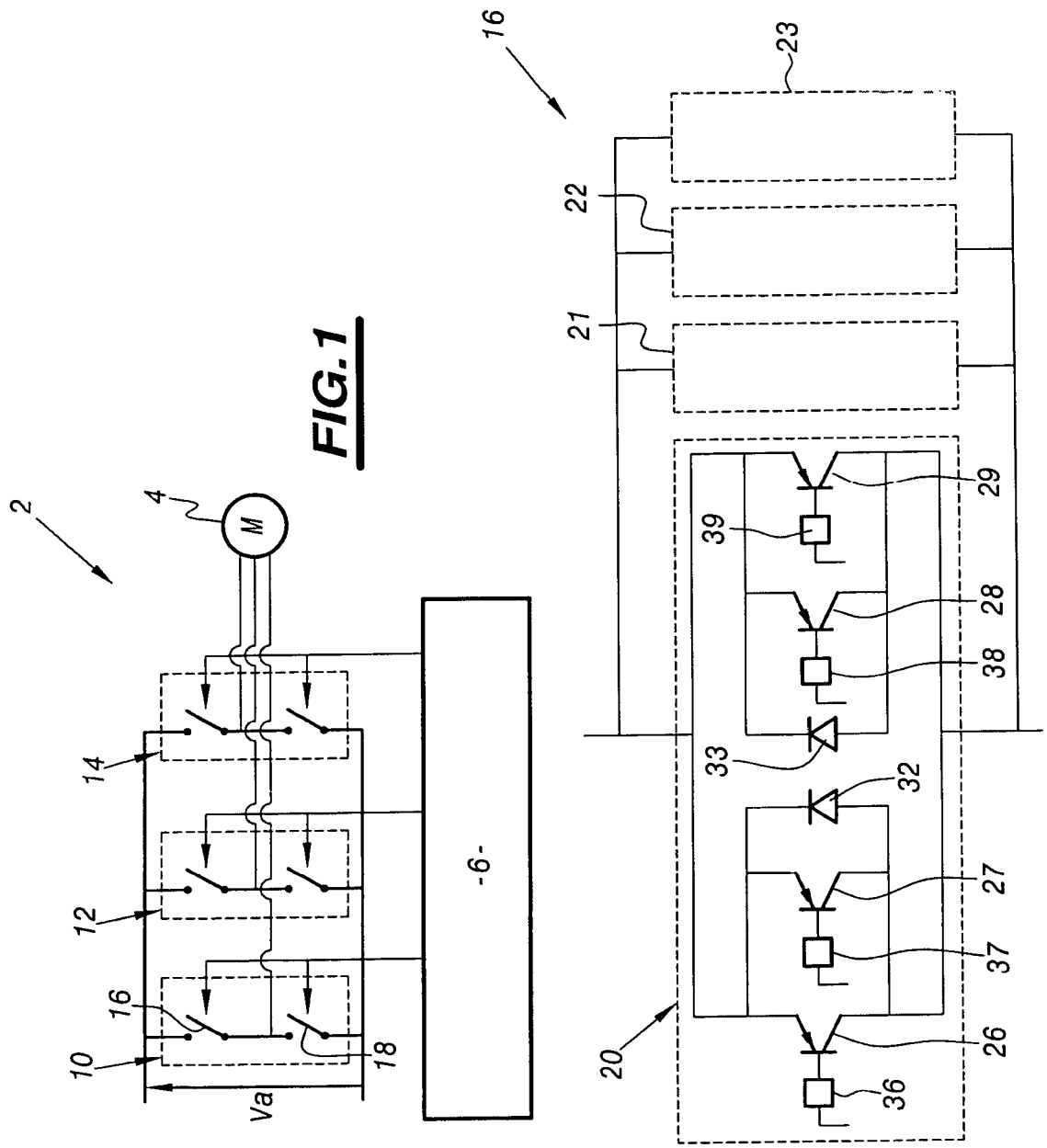

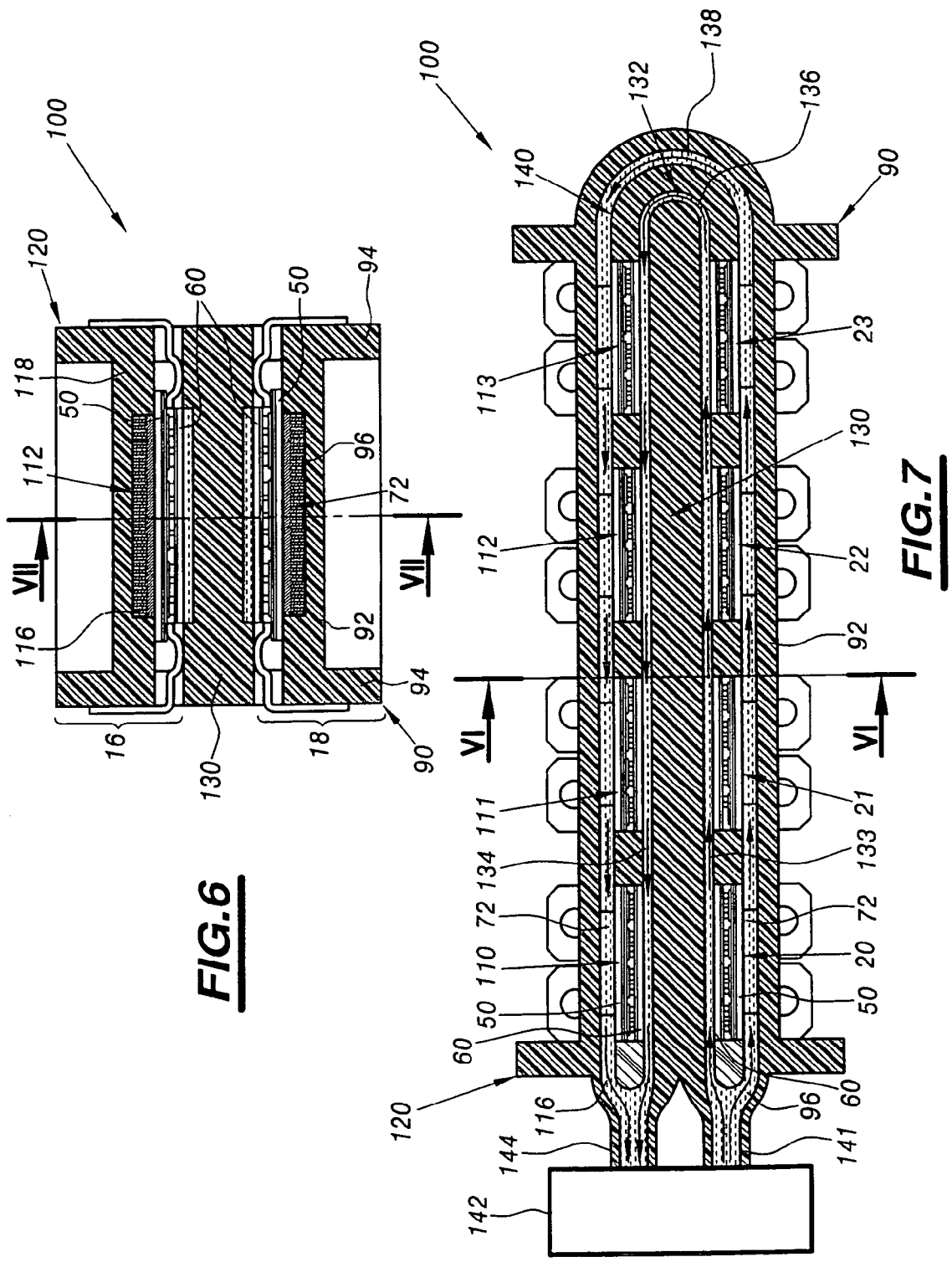

POWER SWITCHING MODULE AND INVERTER EQUIPPED THEREWITH

BACKGROUND OF THE INVENTION

The present invention relates to a power switching module and a multiphase inverter equipped with the module.

In particular, the present invention relates to a power switching module comprising:
- at least one power switch, i.e., at least one top power switch, placed above at least one other power switch, i.e., above at least one bottom power switch, and with each such power switch comprising upper and lower walls that are each adapted to be cooled through thermal conduction by a cooling medium, and
- lower closed channels and upper closed channels configured to circulate a cooling fluid along such lower and upper walls, respectively, of such bottom and top power switches.

Power switching modules of the above kind are used, for example, in three-phase power inverters supplying power to motors of electrical machines, such as the traction motors of a train.

Such power inverters conventionally comprise two interrupters per phase.

The currents to be switched being relatively high, for example on the order of a few thousand amperes, each interrupter is commonly formed of a plurality of power switches, each of which is in turn formed of a multitude of individual interrupters, for example insulated gate bipolar transistors (IGBT). Because of the presence of this multitude of transistors, such power interrupters are bulky and must be cooled to prevent overheating.

To this end, it is known in the art to form a power switching module in which the two interrupters of the same phase are disposed one above the other, so as to thereby reduce the overall size of the module. In such a prior art embodiment, a cooling circuit to evacuate heat generated by the transistors is formed only on the exterior surfaces of the switches of the module. Although this kind of module comprising two interrupters one above the other is less bulky than those used until now, it still has a large overall size.

Thus the invention aims to reduce even further the overall size of a power switching module comprising at least two interrupters placed one above the other.

The patent document GB 1 416 561 discloses a modular arrangement of power semiconductor components in which semiconductor elements are disposed in disc-shaped packages. A cooling liquid may circulate in a space where spring means are located between two stacked packages. This liquid cools the lower wall of the top package and the upper wall of the bottom package. Furthermore, the external walls of this modular arrangement are also cooled by a cooling liquid that circulates lengthwise of the module. Thus it is known in the art to cool a power switching module by a two-fold circulation of cooling liquid, firstly along external walls of the module and secondly inside the module. However, in the modular arrangement described in the above patent document, the spring means in the space between the two stacked packages impedes the flow of cooling liquid along the faces of the internal packages of the module and this limits thermal exchange efficiency. The overall size of the module is still large in relation to the amount of current that the module is able to switch. A relatively large quantity of cooling liquid is needed to dissipate heat via the interior faces of the components.

Thus the teaching of the above document cannot, starting with a prior art switching module in which a cooling circuit is formed exclusively on the exterior surfaces of each of the switches of the module, lead to modifying the module to reduce further its overall size, which is the aim of the invention.

SUMMARY OF THE INVENTION

An object of the invention, therefore, is to provide a power switching module comprising:
- at least one top power switch placed above at least one bottom power switch, and with each such power switch comprising upper and lower walls that are each adapted to be cooled through thermal conduction by a cooling medium, and
- lower closed channels and upper closed channels configured to circulate a cooling fluid along such lower and upper walls, respectively, of such bottom and top power switches,
- and wherein said power switching module further includes a lower void, i.e., passage, in said power switching module located along and above the upper wall of each bottom power switch as well as an upper void, i.e., passage, in said power switching module located along and below the lower wall of each top power switch to cool said walls by circulating a cooling fluid in the lower void and in the upper void.

In the power switching module of the present invention, the switches of each interrupter are cooled both from above and from below. Thus, the heat created by the switching losses of the transistors is removed through two walls. The cooling fluid circulates without impediment in each of the aforementioned lower and upper voids. Accordingly, the transistors, therefore, are cooled more effectively than in the prior art. In general, the amount of current that a transistor is able to switch is limited primarily by the transistor's capacity to dissipate heat. In particular, it has been found that a transistor, which is cooled, is able to switch currents up to five times the nominal current for the transistor. Thus, for the same electrical specifications, the power interrupter formed by the power switches used in the power switching module of the present invention includes fewer transistors than a prior art power interrupter cooled by means of only one wall. As such, because the number of transistors in each power switch of the power interrupter is reduced, the overall size of each such power interrupter is also reduced. Moreover, it has been found that this reduction in the size of each such power interrupter more than adequately counterbalances the increase in the size of the power switching module of the present invention, which results from the presence of additional walls and a second cooling fluid circulation circuit. Consequently, the result is that a power switching module constructed in accordance with the present invention, which is equipped with two cooling circuits, has an overall size that is smaller than that of a prior art power switching module, which has only one cooling circuit.

According to particular embodiments, the power switching module of the present invention may include one or more of the following features:
- wherein the lower void and the upper void have two ends interconnected to form a single cooling fluid circulation circuit;
- wherein each power switch includes a single heatsink that is thermally connected to one of the lower or upper walls, the heatsink being equipped with fins that are adapted to be in direct contact with the cooling liquid, which is circulating in the channels or the voids;

wherein only the upper wall of each top power switch includes a heatsink and only the lower wall of each bottom power switch includes a heatsink;

wherein the fins of the heatsinks are parallel to the main cooling fluid circulation direction;

wherein the lower channels and the upper channels are connected to each other to form a single cooling fluid circulation circuit along the upper wall of each top power switch and along the lower wall of each bottom power switch;

wherein each cooling fluid circulation circuit is connected to the same pump to circulate the cooling fluid in each circulation circuit;

wherein at least the ends of a void and a channel are connected to a common cooling fluid inlet or outlet connector;

wherein a spacer of substantially parallelepiped shape is housed between the top power switch or switches and the bottom power switch or switches so as to maintain a predetermined distance between them and the spacer includes a housing for each power switch;

wherein the shape of the spacer is selected so as to be capable of sealing hermetically the open side of the lower channels and the upper channels;

wherein each power switch includes a plurality of transistors and electrical tracks to which the emitter and/or the gate of each transistor is welded, the tracks being formed on an inside surface of the wall cooled by cooling fluid that circulates in the void;

wherein each power switch further includes electrical tracks to which the collector of each transistor is welded, the tracks being formed on an inside surface of the wall cooled by cooling fluid that circulates in a channel; and wherein the transistors are electrically connected to the electrical tracks by molten weld cylinders.

A further object of the present invention is also to provide a multiphase inverter in which each phase includes two interrupters, each of which is comprised of at least one switch, and wherein the two interrupters of the same phase are created utilizing a single power switching module, which is constructed in accordance with the present invention.

The invention will be better understood on reading the following description, which is given solely by way of example, and with reference to the figures of the drawing.

BRIEF DESCRIPTION OF THE DRAWINGS

FIG. 1 is a block diagram of a power inverter that includes a plurality of interrupters;

FIG. 2 is a partial block diagram of one of the interrupters of the power inverter of FIG. 1;

FIGS. 6 and 7 are cross-sectional views taken along the line VI—VI in FIG. 7 and the line VII—VII in FIG. 6, respectively, of a power switching module constructed in accordance with the present invention.

DETAILED DESCRIPTION OF THE PREFERRED EMBODIMENT

Figure 3:
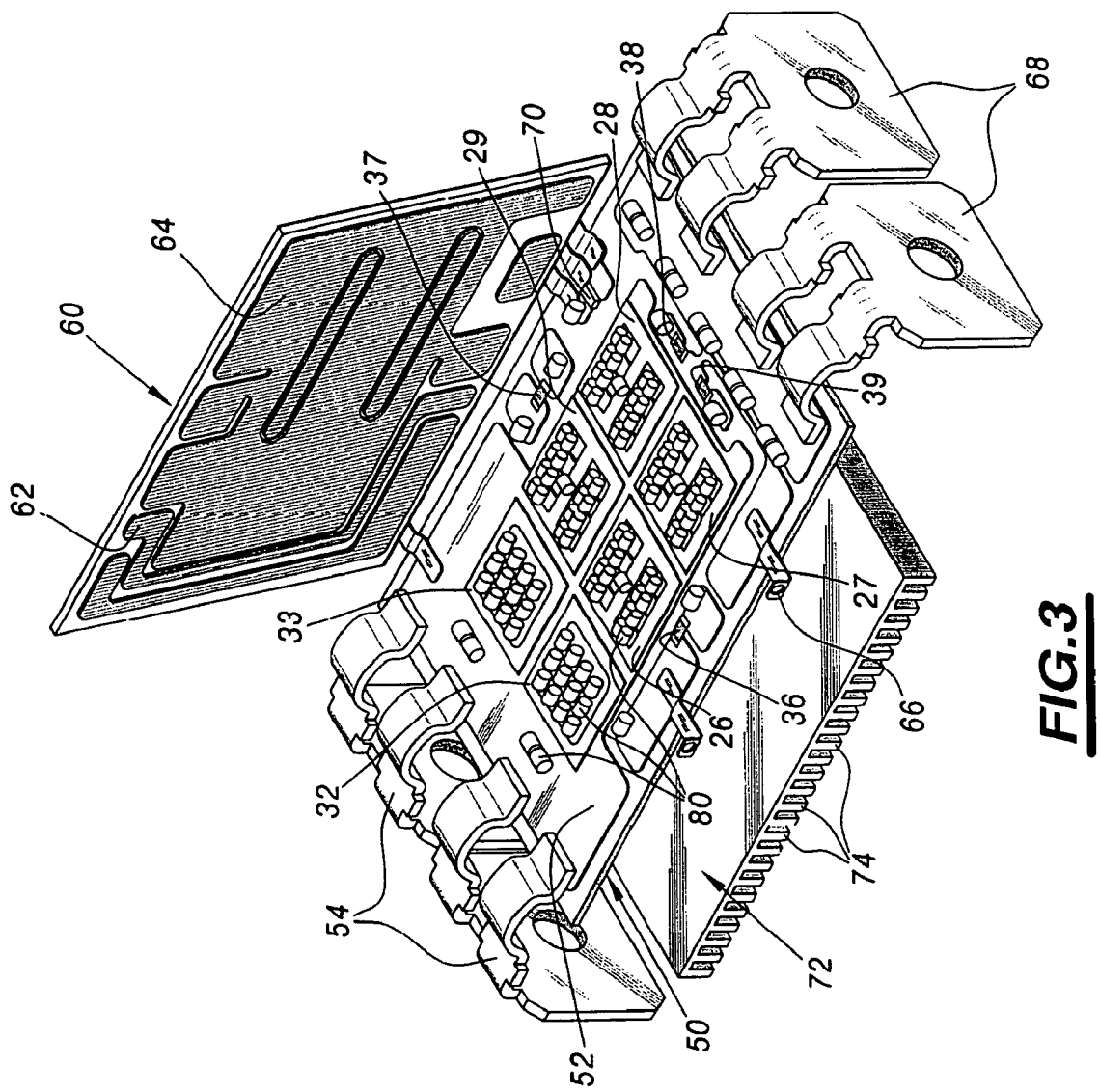
FIG. 3 is an exploded view of a power switch employed in one of the interrupters of the power inverter of FIG. 1.

FIG. 1 shows a three-phase power inverter 2 adapted to supply power to a rotating electrical machine 4 such as a motor under the control of an electronic processor 6.

The motor 4 is, for example, one of the traction motors of a train.

The processor 6 and methods of controlling a three-phase converter are known in the art. For this reason they will not be described in detail here.

The inverter 2 is a conventional circuit and comprises three identical electrical phases 10, 12 and 14 each consisting of two identical power interrupters 16 and 18. In this example each power interrupter is operable to switch currents of several thousand amperes and is also able to withstand potential differences of several thousand volts.

To this end, each interrupter is comprised of a plurality of electrical switches that are connected in parallel.

By way of exemplification and not limitation, FIG. 2 shows an interrupter that consists of four identical switches 20 to 23. Since the switches 20 to 23 are identical, only the switch 20 is shown and described herein in detail.

In accordance with this embodiment, each switch consists of four insulated gate bipolar transistors (IGBT) 26 to 29 connected in parallel and two diodes 32, 33 connected in non-parallel relation to the terminals of the transistors 26 to 29.

Each transistor 26 to 29, by way of exemplification and not limitation, can withstand a voltage of 3 000 volts and a maximum nominal current of 150 amperes. Connecting the transistors 26 to 29 in parallel thus produces a switch 20 that is able to switch a current much greater than that which each of the transistors 26 to 29 thereof is able to withstand.

The gate of each of the transistors 26 to 29 is connected via a respective resistor 36 to 39 to a gate control electrode that is not shown.

FIG. 3 is an exploded perspective view showing the structure of the switch 20. The switch 20 includes a substrate or bottom wall 50, which is made from an electrically insulative and thermally conductive material, such as a dielectric material. The substrate 50 is substantially rectangular and is disposed horizontally.

Etched electrical tracks 52 located on an upward facing interior surface of the substrate 50 connect the collectors of the transistors 26 to 29 to collector electrodes 54. The collector electrodes 54 are brazed to the tracks 52 and project to the outside on the rear shorter side of the substrate 50.

Each transistor 26 to 29 has two opposite plane faces. In FIG. 3, the lower face of each transistor 26 to 29 is shown as being carried by the collector electrodes of the respective transistor, and the upper face of each transistor 26 to 29 is shown as being carried by the gate and emitter electrodes of the same transistor.

The collector of each of the transistors 26 to 29 and the cathode of the diodes 32 and 33 are welded to the tracks 52. In addition to providing the electrical connection, welding assures the thermal connection of the collector of the transistors 26 to 29 to the substrate 50. To ensure a good transfer of heat between the collector of each transistor 26 to 29 and the substrate 50, the welding area is made as large as possible.

The switch 20 also includes a rectangular substrate or upper wall 60 made from an electrically insulative and thermally conductive material. Etched electrical tracks 62, 64 are located on the interior face of the substrate 60 so as to face the substrate 50. The track 62 connects the gates of the transistors 26 to 29 to a gate electrode 66 via resistors 36 to 39. The track 64 connects the emitters of the transistors 26 to 29 to emitter electrodes 68.

In accordance with the embodiment of the present invention depicted in FIG. 3, the gate and emitter electrodes 66, 68 are fixed to the substrate 50.

Finally, the switch 20 also includes a temperature sensor 70 and a heatsink 72.

The temperature sensor 70 is fixed to the inside surface of the substrate 50.

The heatsink 72 is a copper heatsink comprised of a multitude of parallel fins 74. The space between two consecutive fins 74 forms a narrow channel of substantially rectangular cross-section having, for example, a depth of 3 mm and a width of 1 mm. The heatsink 72 is welded to the outside surface of the substrate 50 so that the fins 74 are parallel to the shorter side of the substrate 50.

The substrate 60 is fixed to the substrate 50, so that the substrate 60 lies parallel to and above the substrate 50, preferably by means of a welding method known as the "bump" welding process, using weld cylinders. To this end, weld cylinders 80 are disposed on the surfaces to be electrically and thermally connected to the tracks 62 and 64 of the substrate 60. In accordance with the embodiment of the present invention depicted in FIG. 3, the cylinders 80 are disposed in particular on the anode surface of the diodes 32 and 33, and on the surfaces of the emitters and the gates of the transistors 26 to 29. Other cylinders 80 are also disposed so as to be operable to connect the gate electrodes 66 and the emitter electrodes 68 to the tracks 62 and 64.

To assemble the substrate 60 to the substrate 50, the cylinders 80 are melted to connect the substrate 60 to the substrate 50 electrically, thermally and mechanically. Moreover, thanks to the use of the cylinders 80, the contact area between the tracks 62, 64 and the corresponding surfaces of the emitters and the gates of the transistors 26 to 29 is large thereby ensuring good heat transfer between the welded surfaces.

Because it has been found that the quantity of heat that may be removed via the substrate 50 to which the collectors are welded is much higher than that which can be removed via the substrate 60 to which the emitters and the gates are connected, only one heatsink 72 is fixed to the collector side of the transistors 26 to 29.

Once the substrate 60 has been welded to the substrate 50, the space between these two substrates 50, 60 is filled with a dielectric gel to isolate the electrical components from the external environment.

Figure 4:
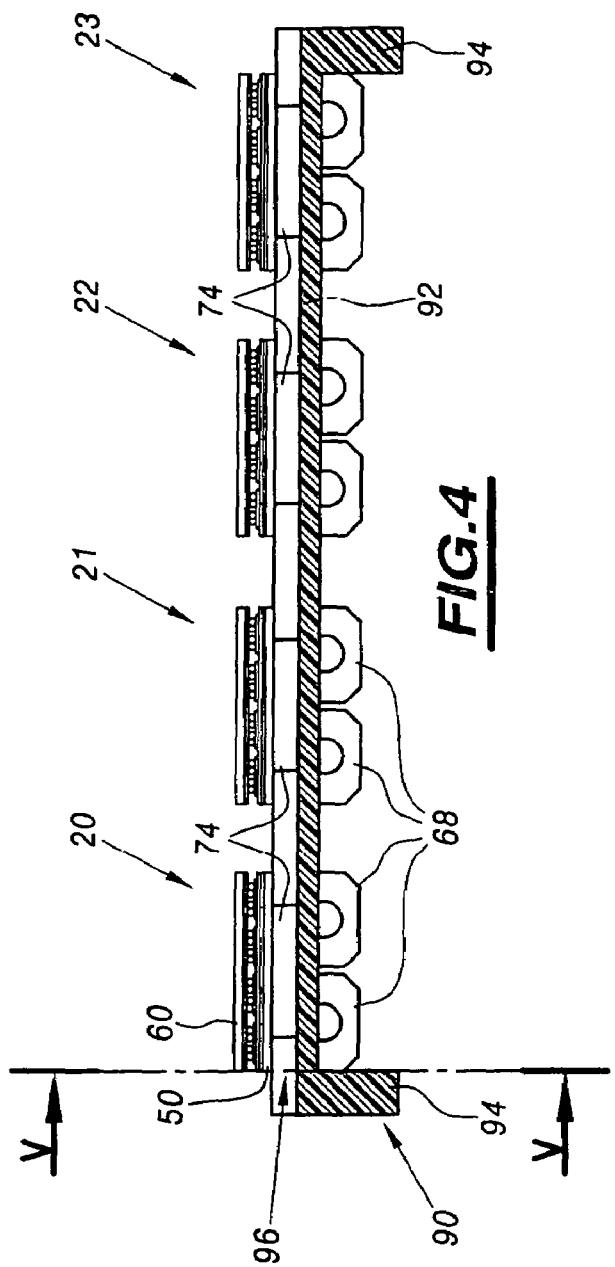
FIGS. 4 and 5 are cross-sectional views taken along the line IV—IV in FIG. 5 and the line V—V in FIG. 4, respectively, of an interrupter of the power inverter of FIG. 1.
Figure 5:
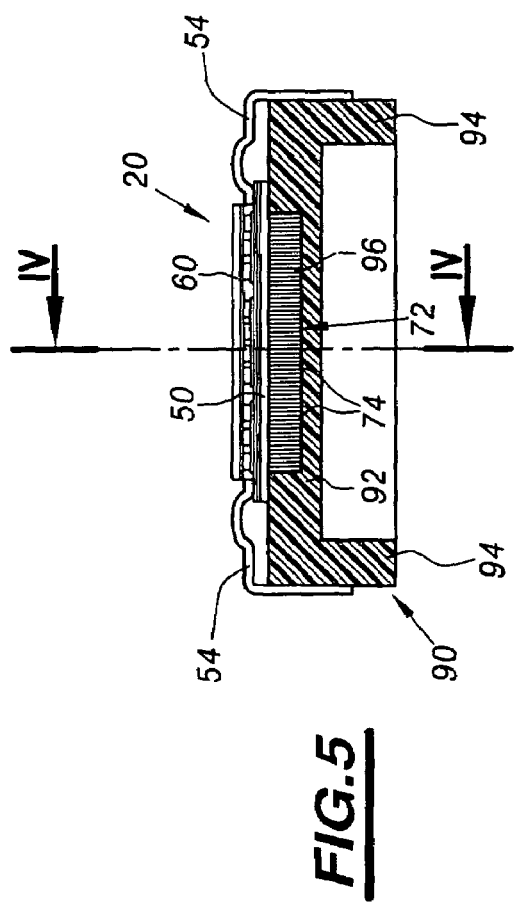

FIGS. 4 and 5 illustrate the structure of the interrupter 18 diagrammatically. The interrupter 18 includes a horizontal lower support 90 made from an electrically insulative material such as a plastic material.

By way of exemplification and not limitation, the support 90 may comprise a horizontal plate 92 embodying the shape of a parallelepiped that is supported by four vertical feet 94 at the corners thereof.

There is an open channel 96 of rectangular shape that extends parallel to the longer side of the plate 92 on the upper surface thereof. The channel 96 is operative to receive a cooling liquid and the heatsinks 72 of the switches 20 to 23. To this end, the width and the depth of the open channel 96 correspond to the width and the height of the heatsink 72. In particular, the depth is chosen so that the free edge at the bottom of each fin 74 is in contact with the bottom of the channel 96 so as to define between the fins 74 a cooling fluid circulation mini-channel. This kind of configuration makes the fins 74 more efficient.

The four switches 20 to 23 forming the interrupter 18 are nested in the support 90 so that their respective heatsinks 72 are accommodated in the channel 96. In accordance with the embodiment of the present invention depicted in FIGS. 4 and 5, the switches 20 to 23 are disposed so that the fins 74 of the heatsinks 72 are parallel to the longer side of the support 90. This configuration facilitates circulation of cooling liquid in the channel 96. Further, in accordance with the embodiment of the present invention depicted in FIGS. 4 and 5, the substrates 50 of the switches 20 to 23 are lined up one behind the other in a common plane that is parallel to the upper surface of the plate 92. The lower surface of the substrates 50 is preferably glued and sealed to the edges of the channel 96.

FIGS. 6 and 7 illustrate diagrammatically the structure of an assembled power switching module 100. The power switching module 100 includes the interrupters 16 and 18 that are disposed, by way of exemplification and not limitation, one above the other in a mirror image configuration.

The structure of the interrupter 16 is identical to that of the interrupter 18, which has been described hereinbefore with reference to FIGS. 4 and 5. In particular, the interrupter 16 comprises four switches 110 to 113, respectively, that are identical to the switches 20 to 23 and that are fixed to a support 120, which is identical to the support 90. In accordance with the embodiment of the present invention depicted in FIGS. 6 and 7, the reference numbers, which have been used hereinbefore in connection with the description and illustration of the switch 20, are also being used for purposes of identifying identical parts of the switches 110 to 113. The switches 110 to 113 are accommodated in an open channel 116.

When assembled, the respective substrates 60 of the switches 16 and 18 face each other.

A horizontal spacer 130 having the shape of a parallelepiped is housed between the respective substrates 60 of the interrupters 16 and 18 so as to thereby hold the switches 110 to 113 at a predetermined distance from the switches 20 to 23.

The spacer 130 includes a housing for each of the switches 20 to 23 and for each of the switches 110 to 113. Moreover, the shape of the spacer 130 is selected so as to be operable to provide a hermetic seal on the open side of the channels 116 and 96.

Inside the spacer 130 is a single first circuit 132 for circulation of a cooling liquid for cooling all of the transistors 26 to 29 of the module 100 via the substrates 60. To this end, two horizontal rectilinear voids, i.e., passages, 133 and 134 of rectangular cross-section extend inside the spacer 130 parallel to the longer side of the spacer 130 and along the outside surface of each of the substrates 60. As viewed with reference to FIG. 7, the left-hand end of these voids 133 and 134 is open and their right-hand ends are fluidically connected via a first semicircular void 136. The thickness of the voids 133 and 134 is preferably less than or equal to 1 mm to maximize heat transfer efficiency relative to the volume of cooling liquid employed.

The spacer 130 also has at its right-hand end a second semicircular void 138 that is fluidically connected to the right-hand ends of the channels 96 and 116. This produces a second circuit 140 for circulation of cooling liquid for cooling all of the transistors 26 to 29 of the module 100 via the substrates 50.

The circuits 132 and 140 each have a U-shaped longitudinal section.

As viewed also with reference to FIG. 7, the right-hand end of the spacer 130, which contains the voids 136 and 138, may by way of exemplification and not limitation be either an integral portion of the spacer 130 or an integral portion of one of the supports 90 or 120.

Inside the module 100, the first and second circuits 132 and 140 are fluidically independent of each other.

The left-hand ends, as viewed with reference to FIG. 7, of the channels 96 and of the voids 133 are fluidically connected via a Y-shaped connector 141 to the outlet of a common pump 142.

Similarly, the left-hand ends, as viewed with reference to FIG. 7, of the channel 116 and of the void 134 are fluidically connected by a Y-shaped connector 144 to the inlet of the same pump 142. Thus a single pump is used to circulate the cooling liquid in both circuits 132 and 140.

In accordance with the embodiment of the present invention depicted in FIGS. 6 and 7, the outlet of the pump 142 is operable to discharge cooling liquid into the circuits 132 and 140, and the inlet of the pump 142 is operable to receive cooling liquid present in the circuits 132 and 140.

The direction of circulation of the cooling liquid within the module 100 is shown by the arrows that are depicted in FIG. 7.

The operation of the module 100 will next be described.

When the interrupters 16 and 18 operate, each transistor 26 to 29 produces heat because of switching losses and also because the transistor is conducting electricity. The greater portion of the heat so produced is transferred to the heatsink 72 via the collector of each transistor 26 to 29 and the substrate 50. The presence of the narrow channels formed by the spaces between the fins 74 of the heatsink 72 increases the area of contact with the cooling liquid circulating in the circuit 140. Heat is, therefore, transferred more efficiently between the heatsink 72 and the cooling liquid.

The remainder of the heat produced by the transistors 26 to 29 is transferred via the substrates 60 directly to the cooling liquid circulating in the circuit 132.

Thus, heating of each transistor 26 to 29 is limited considerably since the transistors 26 to 29 are cooled via their upper and lower faces. It is then possible to use the transistors 26 to 29 to switch currents much higher than the nominal current for which they are designed. Therefore, it is possible, thanks to the presence of the two cooling circuits 140 and 132, respectively, for the upper and lower faces of the transistors 26 to 29, either to fabricate a switching module 100 capable of switching much higher currents with the same number of transistors 26 to 29, or to reduce the number of transistors 26 to 29 and thereby the size of the module 100 in order to be able to switch exactly the same current.

In accordance with the present invention the cooling liquid is preferably water. However, other cooling liquids could also be utilized instead. In addition, it is equally possible to replace the cooling liquid with a gas, such as an inert gas.

In accordance with another embodiment of the present invention, the circuits 132 and 140 may be completely independent from one another, i.e., they may have no fluidic connectors 141 and 144 at the left-hand ends, as viewed with reference to FIG. 7, of the channels 96 and 116 and of the voids 133 and 134, respectively. Even though an embodiment of this kind has no particular advantage a priori, using the pump 142 to circulate a cooling liquid in the circuit 140 and another pump to circulate an inert cooling gas in the circuit 132 may be envisaged.

The module 100 of the preferred embodiment of the present invention described here includes only one first circuit 132 for cooling the substrates 60 and only one second circuit for cooling the substrates 50, with both circuits 132 and 140 being fed by the same pump 142. However, in accordance with yet another embodiment of the present invention, the power module may include a plurality of first cooling circuits for the substrates 60 and a plurality of second cooling circuits for the substrates 50. To this end, the channels 96 and 116 and the voids 133 and 134 are open at each of their right-hand and left-hand ends, as viewed with reference to FIG. 7. Such left-hand open ends are connected to a first pump in a similar manner to that described and illustrated with reference to FIG. 7 and such right-hand open ends in a similar manner are connected to a second pump. In such an embodiment of the present invention, the channels 96 and 116 form two independent first circuits for circulation of a fluid for cooling the substrates 50 of the interrupters 16 and 18, respectively. While, the voids 133 and 134 form two independent second circuits for circulating a fluid for cooling the substrates 60 of the interrupters 16 and 18, respectively.

The module 100 has been described in a specific situation in which the transistors are insulated gate bipolar transistors. However, in a different embodiment of the present invention, the transistors could equally well without departing from the essence of the present invention be bipolar transistors or metal oxide silicon field-effect transistors (MOSFET), or could be replaced by other electronic components that need to be cooled efficiently.

The interrupters 16 and 18 are described here in the particular situation in which they comprise four switches 20 to 23. However, in a different embodiment, a power interrupter 16 and 18 may equally well without departing from the essence of the present invention include more than four switches or may include fewer than four switches, such as, for example, only one switch.

While the invention has been illustrated and described as embodied in specific embodiments, it is not intended to be limited to the details shown, since various modifications and structural changes may be made without departing in any way from the spirit of the present invention.

What is claimed is:

1. A power switching module comprising:
a spacer having a first passage disposed on a first side of said spacer, and a second passage disposed on a second side of said spacer opposite said first side of said spacer, said first and second passages being configured to circulate a cooling medium;
at least one pair of power switches disposed along said spacer, each pair of power switches including:
a first power switch positioned on said first side of said spacer such that a first wall of said first power switch is cooled by said cooling medium in said first passage, and
a second power switch positioned on said second side of said spacer such that a first wall of said second power switch is cooled by said cooling medium in said second passage, wherein each of said first and second power switches includes a second wall opposite said first wall;
a first channel positioned proximate said second wall of said first power switch such that said second wall of said first power switch is cooled by said cooling medium in said first channel; and a second channel positioned proximate said second wall of said second power switch such that said second wall of said second power switch is cooled by said cooling medium in said second channel.

2. The power switching module as claimed in claim 1, wherein said first passage and said second passage have two ends interconnected to form a single cooling medium circulation circuit.

3. The power switching module as claimed in claim 1, wherein said first power switch and said second power switch each include a single heatsink thermally connected to either one of said first wall and said second wall, each said heatsink being equipped with fins positioned so as to be in direct contact with the cooling medium circulating in at least one of said first channel, said second channel, said first passage, and said second passage.

4. The power switching module as claimed in claim 3, wherein only said second wall of said first power switch includes a heatsink and only said second wall of said second power switch includes a heatsink.

5. The power switching module as claimed in claim 3, wherein said fins of said heatsinks extend parallel to a direction of circulation of the cooling medium.

6. The power switching module as claimed in claim 1, wherein said first channel and said second channel are connected to each other to form a single cooling medium circulation circuit.

7. The power switching module as claimed in claim 1, wherein said first passage and said second passage have two ends interconnected to form a single cooling medium circulation circuit, said first channel and said second channel are connected to each other to form a single cooling medium circulation circuit, and said cooling medium circulation circuit is connected to the same pump to effect the circulation of said cooling medium in said cooling medium circulation circuit.

8. The power switching module as claimed in claim 1, wherein at least one end of either one of said first passage and said second passage and at least one end of either one of said first channel and said second channel are connected to a common inlet connector for receiving the cooling medium and to a common outlet connector for discharging the cooling medium.

9. The power switching module as claimed in claim 1, wherein said cooling medium is a liquid.

10. The power switching module as claimed in claim 1 wherein said first power switch and said second power switch each comprises:
 a plurality of transistors, said plurality of transistors each including an emitter, a gate and a collector; and
 first electrical tracks to which one of either said emitter and said gate of each of said plurality of transistors is electrically connected, said first electrical tracks being formed on an inside surface of one of either said first wall and said second wall.

11. The power switching module as claimed in claim 10, wherein said first power switch and said second power switch further comprises second electrical tracks to which said collector of each of said plurality of transistors is electrically connected, said second electrical tracks being formed on an inside surface of either one of said first wall and said second wall.

12. The power switching module as claimed in claim 11, wherein said gate and said emitter of each of said plurality of transistors are electrically connected to said first electrical tracks by molten weld cylinders and said collector of each of said plurality of transistors is electrically connected to said second electrical tracks by molten weld cylinders.

13. The power switching module as claimed in claim 1, wherein said spacer is substantially parallelepiped in shape and includes a housing for each of first and second power switches.

14. The power switching module as claimed in claim 13, wherein said spacer is shaped to hermetically seal an open side of each of said first and second channels.

15. The power switching module as claimed in claim 1, wherein said first passage and said second passage have two ends interconnected to form a single cooling medium circulation circuit, and wherein said spacer is substantially parallelepiped in shape is positioned between said first power switch and said second power switch so that a predetermined distance is maintained between said first power switch and said second power switch, and wherein said spacer includes a housing for each of said first power switch and said second power switch, and wherein said shape of said spacer is such as to permit an open side of said first channel and said second channel to be sealed hermetically thereby, and wherein one cooling medium circulation circuit is formed inside said spacer, and wherein said first passage and said second passage are rectangular in cross-section and extend inside said spacer parallel to the longest side of said spacer.

16. The power switching module as claimed in claim 1, wherein a height of said first passage and of said second passage is not greater than 1 mm.

17. The power switching module as claimed in claim 1, wherein said at least one pair of power switches includes at least two pairs of power switches.

18. The power switching module as claimed in claim 17, wherein said second walls of said first power switches are aligned in a first common plane, and said second walls of said second power switches are aligned in second common plane parallel to said first common plane.

19. A multiphase inverter in which each phase comprises two interrupters, and wherein said two interrupters of the same phase are comprised of a single power switching module, said single power switching module comprising a) at least one power switch placed above at least one other power switch, each power switch including upper walls and lower walls each adapted to be cooled through thermal conduction by a cooling medium, b) lower closed channels and upper closed channels configured to circulate a cooling medium along said lower walls and said upper walls, respectively, of said at least one power switch and of said at least one other power switch, and c) a lower passage in said power switching module along and above said upper wall of said at least one other power switch, and an upper passage in said power switching module along and below said lower wall of said at least one power switch such that said upper walls are cooled by circulating a cooling medium in said lower passage and said lower walls are cooled by circulating a cooling medium in said upper passage.

20. A power switching module comprising:
 a spacer having a first passage disposed on a first side of said spacer, and a second passage disposed on a second side of said spacer opposite said first side of said spacer, said first and second passages being interconnected to form a circulation circuit for a cooling medium;

at least two pairs of power switches disposed along said spacer, each pair of power switches including:
  a first power switch positioned on said first side of said spacer such that a first wall of said first power switch is cooled by said cooling medium in said first passage, and
  a second power switch positioned on said second side of said spacer such that a first wall of said second power switch is cooled by said cooling medium in said second passage, wherein each of said first and second power switches includes a second wall opposite said first wall;
  a first channel positioned proximate said second wall of said first power switch such that said second wall of said first power switch is cooled by said cooling medium in said first channel; and
  a second channel positioned proximate said second wall of said second power switch such that said second wall of said second power switch is cooled by said cooling medium in said second channel, wherein said first and second channels are interconnected to form another circulation circuit for said cooling medium.

* * * * *